United States Patent
Gillig et al.

[11] Patent Number: 5,856,766
[45] Date of Patent: Jan. 5, 1999

[54] COMMUNICATION DEVICE WITH A FREQUENCY COMPENSATING SYNTHESIZER AND METHOD OF PROVIDING SAME

[75] Inventors: Steven F. Gillig, Roselle; Michael L. Bushman, Hanover Park; Lawrence E. Connell, Naperville, all of Ill.

[73] Assignee: Motorola Inc., Schaumburg, Ill.

[21] Appl. No.: 885,003

[22] Filed: Jun. 30, 1997

[51] Int. Cl.[6] .................................. H03L 1/02; H03L 7/06
[52] U.S. Cl. ............................ 331/176; 331/2; 327/105; 455/260
[58] Field of Search ................................ 331/2, 176, 14; 455/260; 327/105

[56] References Cited

U.S. PATENT DOCUMENTS

| | | | |
|---|---|---|---|
| 4,720,688 | 1/1988 | Hasegawa et al. | 331/2 |
| 5,204,972 | 4/1993 | Hashimoto | 331/176 X |
| 5,309,102 | 5/1994 | Deckard | 324/314 |
| 5,436,600 | 7/1995 | Van Heteren | 332/167 |
| 5,576,666 | 11/1996 | Rauvola | 331/25 |
| 5,604,468 | 2/1997 | Gillig | 331/176 |

*Primary Examiner*—Arnold Kinkead
*Attorney, Agent, or Firm*—Brian M. Mancini; Gary J. Cunningham

[57] ABSTRACT

A communication device including a plurality of frequency synthesizers (24, 28, 30). At least one of the frequency synthesizers (24) is driven with a reference frequency from a crystal oscillator (58). The at least one frequency synthesizer (24) includes a phase locked loop with a fractional-N divider (48) which is programmed by a control circuit (64) to vary as a function of temperature compensation, frequency compensation, and a frequency multiplication factor. The output (46) of the at least one frequency synthesizer (24) is used to provide a compensated reference frequency input for the remaining frequency synthesizers (28, 30). The radio provides all the frequency synthesizers (24, 28, 30) with temperature and frequency compensation using a reference frequency from a crystal oscillator (58) and only one high resolution frequency compensating synthesizer (24).

11 Claims, 3 Drawing Sheets

COMMUNICATION DEVICE WITH A FREQUENCY COMPENSATING SYNTHESIZER AND METHOD OF PROVIDING SAME

FIELD OF THE INVENTION

The present invention relates generally to local oscillator frequency synthesizers used in conjunction with piezoelectric frequency oscillators and, in particular, to local oscillator frequency synthesizer compensation in a radio.

BACKGROUND OF THE INVENTION

Radio communication devices require the generation of stable operating frequencies in order to function properly. Typically, stability has been obtained by using a crystal oscillator to provide a reference frequency. The reference frequency is used as a baseline for the frequency synthesizers in the radio. Specifically, the local oscillators of the radio are phase locked to the reference frequency. However, crystal oscillators by themselves can not provide a sufficiently constant frequency to meet the frequency stability requirements of the radio. In particular, the output frequency of a crystal oscillator varies over temperature.

Radios may also require frequency compensation to precisely center a radio transceiver operating frequency onto a base station channel frequency. This is accomplished using an automatic frequency control (AFC) which determines an error between the radio transceiver operating frequency and the base station channel frequency and applies a correction signal to the crystal oscillator to align the radio to the base station. However, the resolution needed to provide AFC correction (typically 50 Hz at 1 GHz) requires the use of a high resolution frequency adjust (warp) circuit in the crystal oscillator which adds cost to the radio.

Methods to temperature compensate crystal oscillators are known in the art. Generally, these methods incorporate compensation circuits composed of analog or digital devices and are used to provide a relatively constant output frequency over temperature. Typically, these circuits are incorporated within the crystal oscillator, and the output of the oscillator is applied as a reference frequency to all the frequency synthesizers or local oscillators of the radio.

A more recent temperature compensation scheme uses an uncompensated crystal oscillator and applies a temperature compensation signal directly to a divider of the phase locked loop of the frequency synthesizer, while at the same time the signal also incorporates the desired frequency multiplication for the frequency synthesizer. For this scheme, since the crystal oscillator is not temperature compensated, the output of the crystal oscillator can not be used to directly provide a stable reference frequency for other local oscillators of the radio unless each frequency synthesizer is temperature compensated by other means, a more costly approach. Furthermore, each frequency synthesizer would need to have a higher resolution than the resolution required to simply step between radio channels in order to provide adequate temperature compensation resolution, which adds cost to the radio.

There is a need for a radio communication device that replaces a temperature compensated crystal oscillator with temperature compensated local oscillators. There is also a need for a radio communication device that can be compensated at the local oscillators. The device should still meet requirements for high performance, low power, and low cost. The radio architecture should minimize the number of high resolution devices, realize both temperature and frequency compensation of local oscillators, and meet radio performance requirements.

DETAILED DESCRIPTION OF THE PREFERRED EMBODIMENT

The present invention provides a radio communication device that replaces a temperature and frequency compensated crystal oscillator with temperature and frequency compensated local oscillator frequency synthesizers. The present invention uses an uncompensated or partially compensated crystal oscillator to provide a reference signal to at least one local oscillator frequency synthesizer which multiplies and compensates the reference signal to create a temperature and frequency compensated output signal which is used as a frequency reference for the remaining local oscillator frequency synthesizers. The present invention provides a radio architecture which requires only the one frequency synthesizer to be of a high resolution configuration. In addition, the present invention meet requirements for high performance, low power, and low cost. It should be noted that the term frequency synthesizer in the present invention encompasses: dividers, phase locked loops, frequency locked loops, and any other device which converts one frequency to another.

Figure 1:
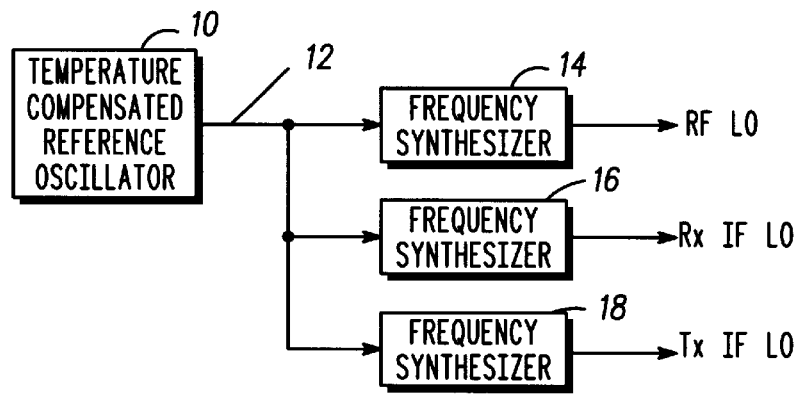
FIG. 1 is a simplified block diagram of a prior art circuit which provides a temperature compensated reference frequency signal to all of the local oscillator frequency synthesizers of a radio.

FIG. 1 shows a prior art radio device using a heterodyne approach and having three frequency synthesizers used to generate radio local oscillator signals: a radio frequency local oscillator (RF LO) 14, and receiver intermediate frequency local oscillator (Rx IF LO) 16, and a transmitter intermediate frequency local oscillator (Tx IF LO) 18. The radio device includes a temperature compensated crystal oscillator (TCXO) 10 which is used to provide a reference frequency 12. The temperature compensated reference frequency 12 is applied to all of the frequency synthesizers 14, 16, 18 in the radio. Each of the frequency synthesizers 14, 16, 18 multiplies the reference frequency 12 to provide an appropriate output frequency for use in the radio. This approach suffers from having an expensive, high resolution, separately temperature and frequency compensated crystal oscillator 10.

Figure 2:
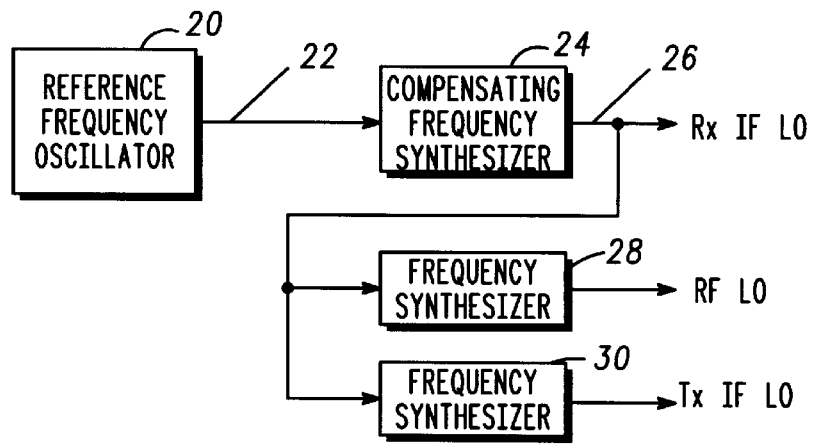
FIG. 2 is a simplified block diagram of the present invention wherein an output frequency of one frequency synthesizer is compensated and used as a reference frequency for at least one of the remaining local oscillator frequency synthesizers, in accordance with the present invention.

FIG. 2 shows a simplified block diagram of the present invention for a heterodyne radio architecture having at least two frequency synthesizers, for example. The present invention includes a reference oscillator 20 having an output frequency 22 and a plurality of frequency synthesizers 24, 28, 30 generating local oscillator signals. At least one of the frequency synthesizers 24 is a frequency-compensating frequency synthesizer. A frequency multiplication factor of the frequency-compensating frequency synthesizer 24 is programmed to vary as a function of at least one of the group consisting of a temperature variation of the output frequency 22 of the reference oscillator 20 and a frequency compensation function of the radio. The output frequency 22 of the reference oscillator 20 is coupled to the at least one frequency synthesizer 24, wherein the at least one frequency synthesizer 24 compensates the output frequency 22 such that a substantially compensated frequency 26 is provided. The compensated frequency 26 of the at least one frequency synthesizer 24 is applied as a reference frequency to at least one of the remaining frequency synthesizers 28, 30.

The reference oscillator 20, such as an uncompensated or partially compensated crystal oscillator (XO) for example, has a known temperature response. The XO provides an uncompensated or partially compensated output frequency 22 which is applied to at least one of the frequency synthesizers 24 in the radio. Using the known temperature response of the XO, the at least one frequency synthesizer 24 is programmed to multiply and temperature and frequency compensate the output frequency 22 to provide a stable desired compensated frequency 26 for use in the radio. Preferably, the at least one frequency synthesizer 24 is the Rx IF LO which provides a fixed compensated frequency 26 for a given radio system platform or mode, i.e. the temperature and frequency compensation does not need to be modified as the radio changes channels. The compensated frequency 26 is applied as a stable reference frequency for the remaining frequency synthesizers 28, 30. The present invention has the advantage of using a simple, low cost crystal oscillator for a reference source and only one high resolution frequency synthesizer 24 which reduces the cost and total current drain on the radio system.

Figure 3:
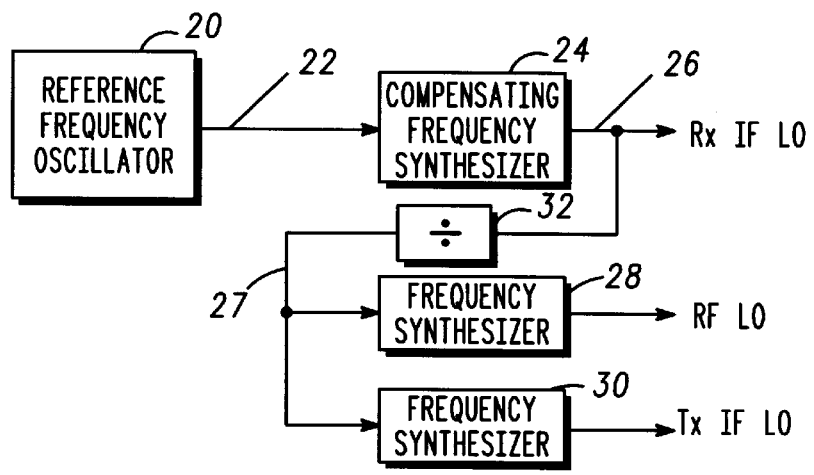
FIG. 3 is a simplified block diagram of one embodiment of the circuit of FIG. 2 wherein a divider is incorporated in an output of the one frequency synthesizer, in accordance with the present invention.

FIG. 3 shows one embodiment of the circuit of FIG. 2, which is hereby incorporated by reference, wherein a divider 32 is incorporated in the output frequency 26 of the one frequency synthesizer 24. The divider 32 lowers the compensated frequency 26 into a more easily usable reference for use in the remaining frequency synthesizers 28, 30. By developing a lower reference frequency 27, the remaining frequency synthesizers can use the lower reference frequency 27 directly and are not required to each provide a divide function. Also, the remaining frequency synthesizers draw less current than if a direct conversion of a higher reference frequency were needed.

Figure 4:
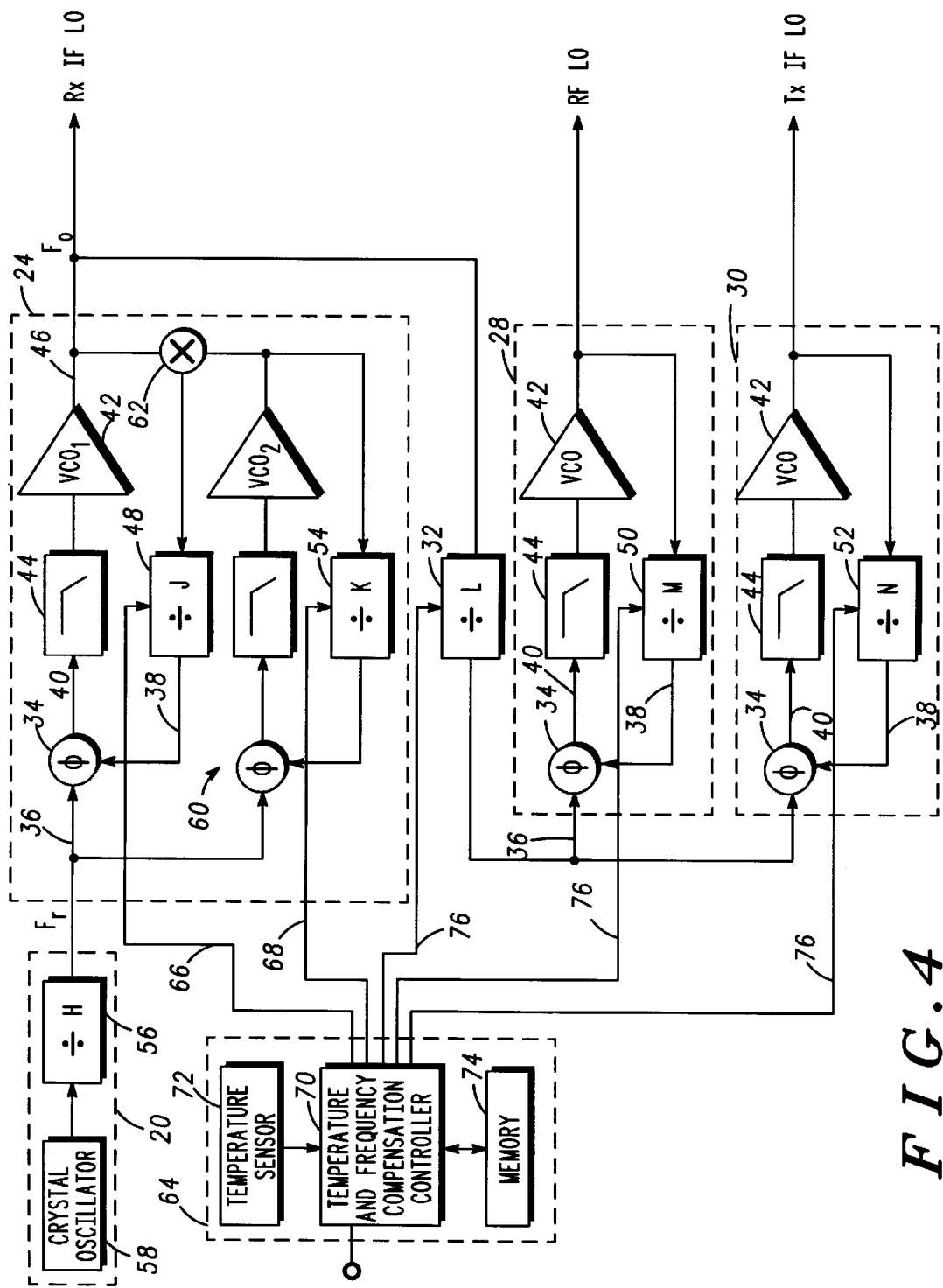
FIG. 4 is a simplified circuit diagram of a preferred embodiment of a radio communication device, in accordance with the present invention.

FIG. 4 shows a simplified circuit diagram of a preferred embodiment of a heterodyne radio communication device, in accordance with the present invention. The preferred embodiment includes a plurality of frequency synthesizers 24, 28, 30 each comprising at least one phase locked loop local oscillator. The phase locked loops include a phase detector 34 which has a reference frequency input 36, a feedback input 38, and one output 40. The output 40 of the phase detector 34 is coupled to a voltage controlled oscillator (VCO) 42 via a low-pass loop filter 44. An output of the VCO is applied back to the feedback input 38 of the phase detector 34 via a frequency divider 48, 50, 52 in a feedback loop. Phase locked loop frequency synthesizers use frequency dividers based on approaches such as integer or fractional division which are known in the art.

At least one of the frequency synthesizers 24 includes compensation and frequency multiplication which comprises: a partially compensated or uncompensated crystal oscillator 58 having an output frequency; at least one frequency multiplication element 48, 54 which is programmed to vary as a function of a temperature variation of the output frequency of the crystal oscillator 58 and to vary as a function of a frequency multiplication factor; and at least one phase locked loop. The crystal oscillator 58 and the at least one frequency multiplication element 48, 54 are coupled to the at least one phase locked loop circuit such that a substantially compensated multiplied frequency output 46 is provided from the at least one frequency synthesizer 24. The operation of a frequency synthesizer and for providing temperature compensation and frequency multiplication within a phase locked loop is fully described in U.S. Pat. No. 5,604,468 issued to Gillig, which is hereby incorporated by reference. In a preferred embodiment, the at least one frequency multiplication element 48, 54 is also programmed to frequency compensate the radio.

The substantially compensated frequency output 46 of the at least one frequency synthesizer 24 is coupled to at least one of the reference frequency inputs 36 of the phase detectors of the phase locked loop local oscillators of the remaining frequency synthesizers 28, 30.

The at least one frequency synthesizer 24 is required to make fine frequency adjustments to account for the small temperature variations of the crystal oscillator 58 and required frequency compensation. Therefore, it is preferred that the at least one frequency synthesizer 24 be of a high resolution configuration. For this, a high resolution fractional frequency divider 48 can be used which provides the lowest noise level. Alternatively, high resolution can be provided through the addition of a second phase locked loop 60 which is mixed with the signal 46 from the phase locked loop via a mixer 62. The two phase locked loops can then use lower resolution integer dividers 48, 54.

The frequency resolution of the at least one frequency synthesizer 24 can also be reduced by the use of a partially compensated crystal oscillator 58 (XO). By partially compensating the crystal oscillator 58, less bits will be required by the divider 48 to provide a stable reference frequency output 46. In the preferred embodiment, a partially temperature and/or frequency compensating signal (not shown) is applied to the XO to partially compensate the XO. This can be an analog or digital signal, such as is used for a VCXO. Preferably, this signal is provided by a digital-to-analog converter (DAC). A second temperature and/or frequency compensating signal is applied to the divider 48 of the at least one frequency synthesizer. This second signal also provides a frequency multiplication signal.

The preferred embodiment provides high frequency accuracy over a wide range of frequencies by allowing the DAC and XO to vary over a narrow range with a fine resolution, and the frequency synthesizer to vary over a wide range with a coarse resolution. The DAC and XO provide fine resolution with compensation on the order of $$Fr(1+A/B)$$

where Fr is the nominal XO frequency with the DAC at 0 (A=0). 1/B is the desired fractional resolution (i.e. B=$10^7$ for 0.1 ppm) and A is the DAC value. A frequency synthesizer with an integer divider provides a coarse resolution with compensation on the order of $$Fr(N/R)$$

where Fr/R is the desired synthesizer resolution, N is the value of the loop divider 48, and N/R is the synthesizer multiplication factor. The output frequency of the frequency synthesizer is $$F_o = F_r(N/R)(1+A/B)$$

The values of A and N are adjusted to achieve the desired frequency. The relationship between A and N is seen as $$((N+1)/R)(1+0/B) = (N/R)(1+A/B)$$

$$1 = NA/B$$

When increasing Fo, if NA>B then A is set to zero and N is incremented by one to N+1. The maximum value of A must be greater than or equal to B divided by the minimum value of N.

The combination of DAC, XO, and PLL frequency synthesizer provide a simple digital interface for a radio microprocessor which allows channel selection and automatic frequency control (AFC) to phase lock to a system standard. This embodiment can be optimized for frequency synthesizer step size and XO range, allowing smaller varactors to be used within the XO and keeping spurious frequency modes in a manageable range. It should also be noted that this embodiment could also be incorporated into the prior art radio of FIG. 1 by using frequency synthesizers having slightly higher resolution, thereby providing even higher overall resolution or an optimal cost tradeoff between TCXO and frequency synthesizer resolution.

In the preferred embodiment, the at least one frequency synthesizer 24 is a receiver IF local oscillator which is fixed for a given radio system platform or mode, i.e. the compensation does not need to be modified as the radio changes channels. In addition, it is preferred that the compensated frequency output 46 of the at least one frequency synthesizer 24 is applied to at least one of the reference frequency inputs 36 of the phase detectors 34 of the phase locked loops of the remaining frequency synthesizers 28, 30 via a frequency divider 32. The frequency divider 32 further reduces the input frequency to the remaining frequency synthesizers 28, 30. Also, the frequency divider 32 can be programmed to vary as the function of the temperature variation of the crystal oscillator 58 of the at least one frequency synthesizer 24 and to vary as a function of a frequency dividing factor.

Also, in a preferred embodiment, the at least one frequency synthesizer 24 is a phase locked loop circuit and the divider 48 is a multi-modulus (fractional-N) divider, preferably adjusted by a noise shaping digital modulator to permit fractional division of a frequency, allowing finer resolution than integer dividers. In a more preferred embodiment, the at least one frequency synthesizer 24 is a single phase locked loop circuit and the divider 48 is a dual-modulus divider. The use of a single high resolution divider is preferred because of the reduced parts count.

Each of the dividers 32, 48, 50, 52, 54, 56 of the present invention can be programmed and controlled via a temperature compensation control circuit 64 which applies a temperature-dependent control signal 66 to the divider 48. The divider 48 can also be used to compensate for frequency drift in the other components of the radio. Where a second PLL is used, a second temperature compensation control signal 68 is applied to the divider 54 of the second PLL 60. The dividers 48, 54 are used multiply the crystal oscillator frequency, provide compensation, and provide frequency synthesis.

The control circuit 64 includes a temperature and frequency compensation controller 70, a temperature sensor 72, and a memory 74. Preferably, the memory 74 contains a preprogrammed lookup table of temperature compensating data from previous temperature training of the crystal oscillator 58 that correspond to predetermined temperature varying voltage signals provided by the temperature sensor 72. Alternatively, the memory 74 can contain an algorithm to calculate the temperature compensating data or a combination of a look-up table and a calculation. Typically, the sensor 72 is located in proximity to the crystal oscillator 58 to reduce errors which may arise due to temperature gradients across the radio. The temperature compensation control circuit 64 monitors a temperature signal from the connected temperature sensor 72 and uses the temperature signal to look up or calculate a value corresponding to the temperature signal in the connecting memory 74. As the sensor 72 indicates a change in ambient temperature, the memory 74 supplies the appropriate corresponding compensation value to the controller 70. The controller is also responsive to a frequency compensation signal, such as from an AFC circuit of the radio, for example. The controller 70 then produces an appropriate temperature and frequency compensation control signal 66 (68) along with a desired PLL multiplication factor to the divider 48 (54) of the at least one frequency synthesizer 24. In this way, the control circuit 64 provides for a compensated and multiplied frequency synthesizer output 46.

The control circuit 64 also applies a desired set 76 of frequency multiplication factors to the dividers 50, 52 of the remaining frequency synthesizers 28, 30. These dividers 50, 52 do not need to provide temperature compensation, as the reference frequency 46 supplied to the frequency synthesizers has already been temperature compensated in the at least one frequency synthesizer 24. Preferably, divider 32 is also controlled by the set 76 of frequency multiplication factors, since temperature compensation is not needed at this divider 32 for the above reasons. Optionally, the reference source divider 56 and crystal oscillator 58 itself can be controlled by the controller 70.

The operation of the present invention can be shown by example, with reference to the invention of FIG. 4. First, let the divider 48 (54) have a fixed value at a given temperature. Let $F_o$ be the multiplied and temperature and frequency compensated output 46 of the at least one frequency synthesizer 24, and let $F_r$ be the frequency of the reference frequency source 20. For a fractional divider value of J:

$$J = \text{Num}/\text{Den}$$

where Den is fixed by the length of an accumulator and Num is variable. Then $$F_o = F_r[\text{Num}/(\text{Den}*H)]$$

where H is the divider 56 value of the reference oscillator 20. For an integer divider J, Den=1. The change in the multiplied and compensated output frequency, $F_o$, with respect to a change in Num is:

$$\frac{\partial F_o}{\partial \text{Num}} = \frac{\partial}{\partial \text{Num}}(F_r[\text{Num}/(\text{Den}*H)])$$

$$= F_r/(\text{Den}*H)$$

The smallest allowable change in frequency in this example occurs when Num changes by one. This represents the smallest possible frequency resolution at $F_o$. For a desired resolution of 10 Hz at a reference source frequency of 2.1 MHz, Den and H must be chosen such that only one step in Num changes $F_o$ by no more than 10 Hz. If H=8, the loop frequency will be $$F_{loop}=2.1 \text{ MHz}/8=262.5 \text{ kHz}$$

and Den is found to be $$\text{Den}=F_{loop}/10 \text{ Hz}=26250$$

and $$\log_2(26250)=14.68 \text{ bits}$$

Therefore, a 15 bit accumulator ($2^{15}$=32768) would be needed to meet the desired 10 Hz resolution requirement. At a reference source frequency of 2.1 MHz, one step in Num would result in a change of about 8 Hz which is sufficient to meet the desired 10 Hz resolution.

Figure 5:
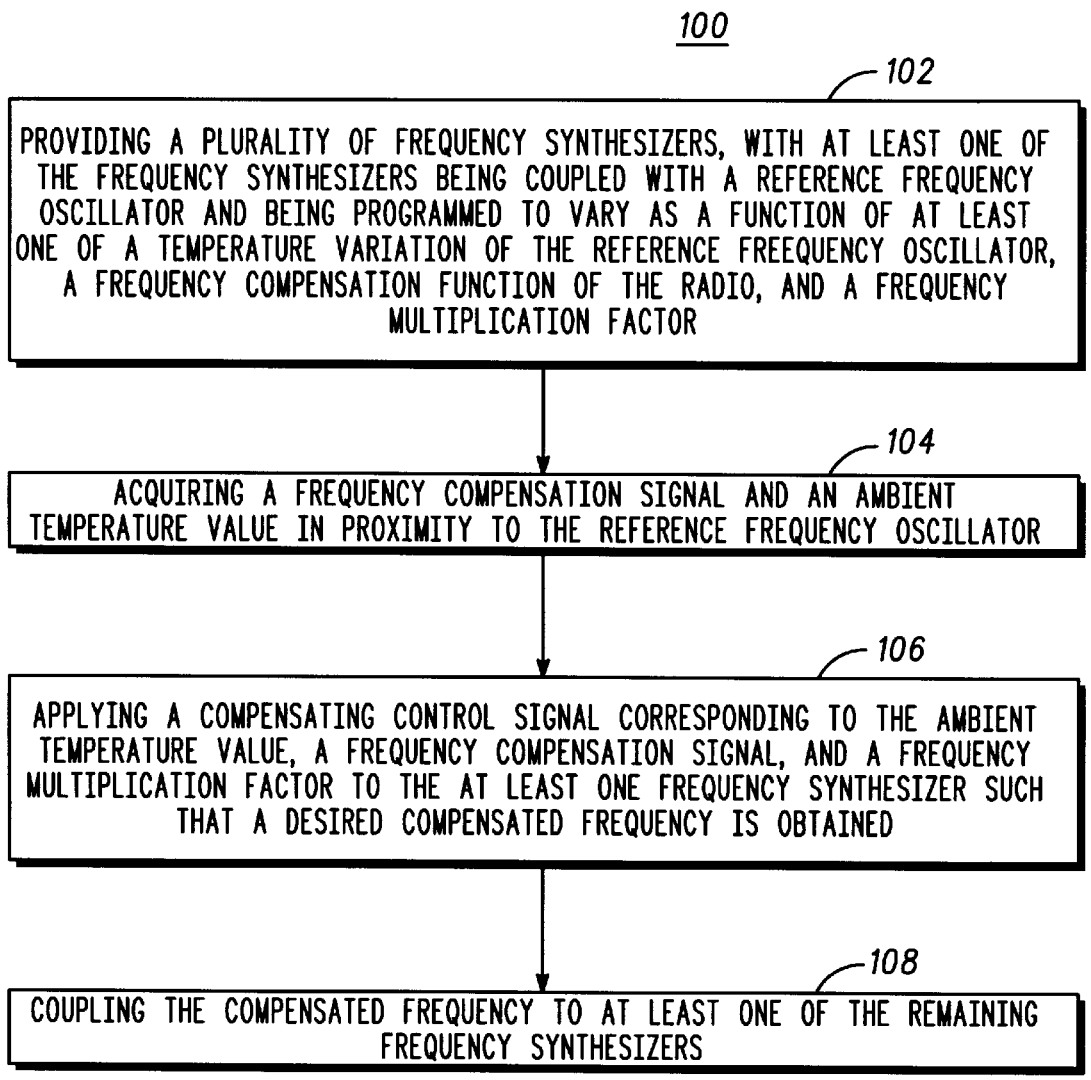
FIG. 5 is a flow diagram of a method to provide frequency multiplied and compensated local oscillator frequency synthesizers, in accordance with the present invention.

FIG. 5 shows a flow diagram of a method 100 of compensating local oscillator frequency signals in a radio communication device, in accordance with the present invention. This method includes a first step 102 providing a plurality of frequency synthesizers having respective inputs and generating local oscillator signals. At least one of the frequency synthesizers being coupled with a partially compensated or uncompensated reference oscillator, such as a crystal oscillator, via a respective input to at least one frequency multiplication element. The element of the at least one frequency synthesizer is programmed to vary as a function of at least one of: a temperature variation of the reference oscillator, a frequency compensation function of the radio, and a frequency multiplication factor.

A second step 104 includes acquiring a frequency compensation signal and an ambient temperature value in proximity to the reference oscillator. A third step 106 includes applying a predetermined compensating control signal corresponding to the ambient temperature value, a frequency compensation signal, and a frequency multiplication factor to the at least one frequency synthesizer such that a desired compensated frequency is obtained. The control signal can be obtained from a memory, a look-up table, or by calculation.

A fourth step 108 includes coupling the compensated frequency to at least one of the respective inputs of the remaining frequency synthesizers.

In a preferred embodiment, the providing step includes providing a frequency divider, and wherein the coupling step includes coupling the compensated frequency to the at least one of the respective inputs of the remaining frequency synthesizers via the frequency divider.

In an alternate preferred embodiment, the providing step includes the reference oscillator being a partially temperature compensated crystal oscillator. More preferably, the applying step includes applying a first partially compensating signal to the crystal oscillator to provide a fine resolution and applying a second partially compensating and frequency multiplying signal to the at least one frequency synthesizer to provide a coarse resolution. Either of the partially compensating signals can contain one or more of a temperature compensating signal for the crystal oscillator, a frequency compensating signal for the radio, and a frequency multiplying signal.

In particular, the applying step includes applying a predetermined temperature and frequency compensating control signal corresponding to the ambient temperature value and a frequency control signal, respectively, and the frequency multiplication factor to the at least one frequency synthesizer.

The present invention advantageously incorporates an uncompensated or partially compensated crystal oscillator which is used as a frequency input for one high resolution frequency synthesizer which is preferably used as a Rx IF LO. The Rx IF LO multiplies and temperature and frequency compensates the frequency input. The output signal from the Rx IF LO is used as a temperature and frequency compensated reference signal for the other LO frequency synthesizers in the radio. In this way the other local oscillator frequency synthesizers are temperature and frequency compensated without needing high resolution. In particular, by compensating the Rx IF LO, which is a fixed frequency for a given radio system platform or mode, the compensation does not need to be modified as the radio changes channel. In addition, the compensation resides in the receiver, which allows the transmit LO frequency synthesizer to be disabled, saving power, without effecting the compensation of the receiver. Also, the Tx IF LO is more amenable to semiconductor integration because the synthesizer's PLL bandwidth can be higher than if it were required to have high resolution.

Described in another way, the present invention uses a master high resolution frequency synthesizer to perform temperature and frequency compensation of a local oscillator using an uncompensated or partially compensated crystal oscillator signal as a reference, and other local oscillator frequency synthesizers are slaved to that master high resolution frequency synthesizer.

One embodiment of the present invention also has the advantage of performing an entirely digital compensation of the radio transceiver operating frequency using one compensation element. The uncompensated crystal oscillator XO does not require the analog tuning of a TCXO or the digital bus lines to a TCXO. Also, XOs present less noise to a radio than TCXOs.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A radio communication device, comprising:
a partially compensated crystal oscillator having an output frequency;
a plurality of frequency synthesizers generating local oscillator signals, each frequency synthesizer having a reference frequency input;
at least one of the frequency synthesizers being a partially frequency compensating synthesizer, a frequency multiplication factor of the partially frequency compensating synthesizer being programmed to vary as a function of at least one of the group consisting of a temperature variation of the crystal oscillator output frequency and a frequency compensation signal from an AFC circuit of the radio;
the crystal oscillator being coupled to the at least one frequency synthesizer, wherein the at least one frequency synthesizer multiplies and partially compensates the partially compensated crystal oscillator output frequency such that a substantially compensated frequency is provided;
a control circuit including a temperature sensor and a memory being coupled to a temperature and frequency compensation controller, the controller of the control circuit being coupled to the crystal oscillator and the at least one frequency synthesizer, the controller being responsive to a temperature signal from the temperature sensor and the frequency compensation signal from the AFC circuit of the radio; and the control circuit couples a first partially compensating signal to the crystal oscillator to provide a fine resolution, and wherein the control circuit couples a second partially compensating signal to the at least one frequency synthesizer to program a frequency multiplying factor of the frequency compensating synthesizer to provide a coarse resolution, the partially compensating signals each providing at least one of the group consisting of a temperature compensation of the oscillator frequency and a frequency compensation signal from an AFC circuit of the radio;

the substantially compensated frequency of the at least one frequency synthesizer being applied as a reference frequency to at least one reference frequency input of the remaining frequency synthesizers.

2. The radio communication device of claim 1, wherein the partially frequency compensating synthesizer is a phase locked loop.

3. The radio communication device of claim 1, wherein the frequency multiplication factor is determined by a fractional-N divider.

4. The radio communication device of claim 1, wherein the partially frequency compensating synthesizer has a higher resolution than the remaining frequency synthesizers.

5. The radio communication device of claim 1, wherein the partially frequency compensating synthesizer is a phase locked loop and the frequency multiplication factor is determined by a fractional-N divider.

6. The radio communication device of claim 1, wherein the partially frequency compensating synthesizer provides a receiver IF local oscillator signal.

7. The radio communication device of claim 1, wherein the partially frequency compensating synthesizer is a phase locked loop including a fractional-N divider, and wherein the partially frequency compensating synthesizer provides a receiver IF local oscillator signal.

8. The radio communication device of claim 1, wherein the partially frequency compensating synthesizer includes two phase locked loop circuits with two associated frequency multiplication factors, the loop circuits being coupled by a mixer in the partially frequency compensating synthesizer.

9. The radio communication device of claim 1, further comprising a frequency divider, and wherein the substantially compensated frequency of the partially frequency compensating synthesizer is coupled to at least one of the reference frequency inputs of the remaining frequency synthesizers via the frequency divider.

10. A method of compensating local oscillator frequency signals in a radio communication device, comprising the steps of:

providing a plurality of frequency synthesizers having respective inputs and generating local oscillator signals, with at least one of the frequency synthesizers being coupled with a partially temperature compensated crystal oscillator via a respective input and being programmed to vary as a function of at least one of the group consisting of a temperature variation of the partially temperature compensated crystal oscillator, a frequency compensation signal from an AFC circuit of the radio, and a frequency multiplication factor;

acquiring a frequency compensation signal and an ambient temperature value in proximity to the partially temperature compensated crystal oscillator;

applying a first partially compensating signal to the partially temperature compensated crystal oscillator to provide a fine resolution and applying a second partially compensating and frequency multiplying signal to the at least one frequency synthesizer to provide a coarse resolution such that a desired substantially compensated frequency is obtained, the partially compensating signals each providing at least one of the group consisting of a temperature compensation for the crystal oscillator and a frequency compensation signal from an AFC circuit of the radio; and coupling the substantially compensated frequency to at least one of the respective inputs of the remaining frequency synthesizers.

11. The method of claim 10, wherein the providing step includes providing a frequency divider, and wherein the coupling step includes coupling the substantially compensated frequency to the at least one of the respective inputs of the remaining frequency synthesizers via the frequency divider.

* * * * *